(12) United States Patent
Ono et al.

(10) Patent No.: US 11,094,557 B2
(45) Date of Patent: Aug. 17, 2021

(54) SILICON WAFER

(71) Applicant: SUMCO CORPORATION, Tokyo (JP)

(72) Inventors: Toshiaki Ono, Tokyo (JP); Shigeru Umeno, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 136 days.

(21) Appl. No.: 16/609,021

(22) PCT Filed: Jun. 19, 2018

(86) PCT No.: PCT/JP2018/023218
§ 371 (c)(1),
(2) Date: Oct. 28, 2019

(87) PCT Pub. No.: WO2019/003999
PCT Pub. Date: Jan. 3, 2019

(65) Prior Publication Data
US 2020/0083060 A1    Mar. 12, 2020

(30) Foreign Application Priority Data
Jun. 26, 2017  (JP) .............................. JP2017-124294

(51) Int. Cl.
*C30B 29/06*     (2006.01)
*H01L 21/322*    (2006.01)
(Continued)

(52) U.S. Cl.
CPC .......... *H01L 21/3225* (2013.01); *C30B 29/06* (2013.01); *C30B 30/04* (2013.01); *C30B 33/02* (2013.01)

(58) Field of Classification Search
CPC ....... C30B 29/06; C30B 15/04; C30B 15/203; C30B 15/206
See application file for complete search history.

(56) References Cited

U.S. PATENT DOCUMENTS

| | | | |
|---|---|---|---|
| 2002/0081440 A1* | 6/2002 | Murakami | ............ C30B 15/203 428/446 |
| 2003/0079674 A1 | 5/2003 | Tachikawa et al. | |

(Continued)

FOREIGN PATENT DOCUMENTS

| | | | |
|---|---|---|---|
| CN | 1437229 A | 8/2003 | |
| CN | 1545725 A | 11/2004 | |

(Continued)

OTHER PUBLICATIONS

International Search Report issued in International Patent Application No. PCT/JP2018/023218, dated Aug. 14, 2018; and English-language translation thereof.

(Continued)

*Primary Examiner* — Robert M Kunemund
(74) *Attorney, Agent, or Firm* — Greenblum & Bernstein, P.L.C.

(57) ABSTRACT

A silicon wafer having a BMD density of $5\times10^8/cm^3$ or more and $2.5\times10^{10}/cm^3$ or less in a region of 80 μm to 285 μm from the wafer surface when the silicon wafer is heat-treated at a temperature X (° C., 700° C.≤X≤1000° C.) for a time Y (min) and then subjected to an infrared tomography method in which the laser power is set to 50 mW and the exposure time of a detector is set to 50 msec. The time Y and the temperature X satisfy $Y=7.88\times10^{67}\times X^{-22.5}$.

9 Claims, 1 Drawing Sheet

(51) Int. Cl.
*C30B 30/04* (2006.01)
*C30B 33/02* (2006.01)

(56) References Cited

U.S. PATENT DOCUMENTS

| | | |
|---|---|---|
| 2003/0148634 A1 | 8/2003 | Holzl et al. |
| 2004/0180505 A1 | 9/2004 | Tobe |
| 2005/0048247 A1 | 3/2005 | Mule'Stagno et al. |
| 2006/0150894 A1 | 7/2006 | Kobayashi |
| 2010/0038757 A1* | 2/2010 | Isogai ............... C30B 29/06 257/655 |
| 2010/0155903 A1 | 6/2010 | Ishisaka et al. |
| 2011/0053350 A1* | 3/2011 | Watanabe ............ C30B 25/20 438/473 |
| 2013/0175726 A1* | 7/2013 | Minami ............. C30B 33/005 264/81 |
| 2016/0042974 A1 | 2/2016 | Ono et al. |
| 2017/0253995 A1 | 9/2017 | Qu et al. |
| 2018/0108538 A1 | 4/2018 | Katano |
| 2018/0266016 A1* | 9/2018 | Lu ....................... C30B 15/206 |
| 2018/0371639 A1* | 12/2018 | Mueller .............. C30B 15/04 |

FOREIGN PATENT DOCUMENTS

| | | |
|---|---|---|
| CN | 1836062 A | 9/2006 |
| CN | 101638807 A | 2/2010 |
| CN | 101748491 A | 6/2010 |
| JP | 11-092283 | 4/1999 |
| JP | 2003-055088 | 2/2003 |
| JP | 2012-049397 | 3/2012 |
| JP | 2013-163598 | 8/2013 |
| JP | 2014-201468 A | 10/2014 |
| TW | 201603141 A | 1/2016 |
| WO | 2016/084287 | 6/2016 |
| WO | 2016/181787 | 11/2016 |

OTHER PUBLICATIONS

Written Opinion of the International Searching Authority for International Patent Application No. PCT/JP2018/023218, dated Aug. 14, 2018; and English-language translation thereof.
International Preliminary Report on Patentability for International Patent Application No. PCT/JP2018/023218, dated Dec. 31, 2019; and English-language translation thereof.
Office Action for CN App. No. 201880043135.2, dated Mar. 17, 2021 (w/ translation).
Liu Yuling et al., "Super-large-scale integrated circuit substrate material performance and processing test technology engineering", Metallurgical Industry Press (2002), p. 237, section 8.1.3.3, paragraph 3 BEST COPY AVAILABLE (cited in CN Office Action— see cite No. C01 of this IDS; discussed in paragraph bridging pages 8 and 9 of the translation provided).

* cited by examiner

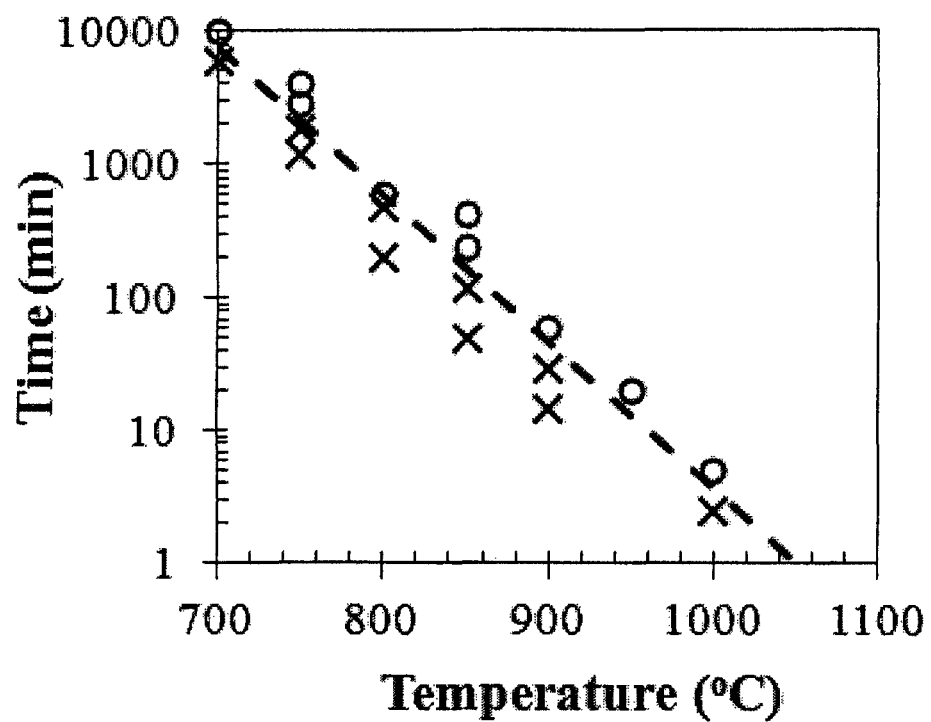

SILICON WAFER

TECHNICAL FIELD

The present invention relates to a silicon wafer and particularly to a silicon wafer suitable even for a low-temperature device process.

BACKGROUND ART

An epitaxial silicon wafer is known, which has a sufficient gettering capability even when the heat treatment in a production step for semiconductor devices is performed under a low temperature (Patent Document 1: JP2014-201468A). The epitaxial silicon wafer is cut out from a silicon single crystal grown by the Czochralski method and has a diameter of 300 mm or more. When the crystal is grown, the required time for lowering the temperature of each part of the silicon single crystal from 800° C. to 600° C. is 450 minutes or less. The interstitial oxygen concentration is $1.5 \times 10^{18}$ to $2.2 \times 10^{18}$ atoms/cm$^3$ (old ASTM), and the nitrogen concentration and the carbon concentration are not higher than respective predetermined values. The entire surface of the silicon wafer consists of a COP region. A wafer bulk part at the epitaxial layer surface has a BMD density of $1 \times 10^4$/cm$^2$ or less after heat treatment of 1000° C.×16 hours.

PRIOR ART DOCUMENT

Patent Document

[Patent Document 1] JP2014-201468A

SUMMARY OF INVENTION

Problems to be Solved by Invention

In the above conventional technique, however, long-time heat treatment of 1000° C.×16 hours is performed as evaluation heat treatment to ensure the gettering capability owing to the BMD density after the heat treatment. It is thus necessary to ensure the gettering capability with more reliable evaluation heat treatment adapted to a lowered temperature of the heat treatment in a production step for semiconductor devices.

A problem to be solved by the present invention is to provide a silicon wafer suitable even for a low-temperature device process.

Means for Solving Problems

According to a first aspect of the present invention, the above problem is solved by providing a silicon wafer having a BMD density of $5 \times 10^8$/cm$^3$ or more and $2.5 \times 10^{10}$/cm$^3$ or less in a region of 80 μm to 285 μm from the wafer surface when the silicon wafer is heat-treated at a temperature X (° C., 700° C.≤X≤1000° C.) for a time Y (min) and then subjected to an infrared tomography method in which the laser power is set to 50 mW and the exposure time of a detector is set to 50 msec, the time Y and the temperature X satisfying $Y = 7.88 \times 10^{67} \times X^{-22.5}$.

According to a second aspect of the present invention, the above problem is solved by providing a silicon wafer having an average BMD size of 16 nm or more and 28 nm or less in a region of 80 μm to 285 μm from the wafer surface when the silicon wafer is heat-treated at a temperature X (° C., 700° C.≤X≤1000° C.) for a time Y (min) and then subjected to an infrared tomography method in which the laser power is set to 50 mW and the exposure time of a detector is set to 50 msec, the time Y and the temperature X satisfying $Y1 = 7.88 \times 10^{67} \times X^{-22.5}$ and $1.0 \leq Y/Y1 \leq 1.5$.

According to a third aspect of the present invention, the above problem is solved by providing a silicon wafer having a BMD density of $5 \times 10^8$/cm$^3$ or more and $2.5 \times 10^{10}$/cm$^3$ or less in a region of 80 μm to 285 μm from the wafer surface when the silicon wafer is heat-treated at a temperature X (° C., 700° C.≤X≤1000° C.) for a time Y (min) and then subjected to an infrared tomography method in which the laser power is set to 50 mW and the exposure time of a detector is set to 50 msec, the time Y and the temperature X satisfying $Y = 7.88 \times 10^{67} \times X^{-22.5}$, the silicon wafer having an average BMD size of 16 nm or more and 28 nm or less in the region of 80 μm to 285 μm from the wafer surface when the silicon wafer is heat-treated at a temperature X (° C., 700° C.≤X≤1000° C.) for a time Y (min) and then subjected to the infrared tomography method in which the laser power is set to 50 mW and the exposure time of the detector is set to 50 msec, the time Y and the temperature X satisfying $Y1 = 7.88 \times 10^{67} \times X^{-22.5}$ and $1.0 \leq Y/Y1 \leq 1.5$.

In the above invention, the surface may be formed with an epitaxial layer having a thickness of 1 to 5 μm. Additionally or alternatively, the silicon wafer may have a nitrogen concentration of $1 \times 10^{12}$ to $5 \times 10^{14}$ atoms/cm$^3$ and an oxygen concentration of $8 \times 10^{17}$ to $15 \times 10^{17}$ atoms/cm$^3$.

Effect of Invention

According to the present invention, when the time is represented by Y (min) and the temperature is represented by X (° C., 700° C.≤X≤1000° C.), the evaluation heat treatment is performed with the time Y and the temperature X which satisfy $Y = 7.88 \times 10^{67} \times X^{-22.5}$, and the gettering capability can therefore be ensured with high reliability under a condition of relatively low temperature and short time. As a result, a silicon wafer suitable even for a low-temperature device process can be provided.

BRIEF DESCRIPTION OF DRAWING(S)

FIG. 1 is a graph illustrating the relationship between an evaluation heat treatment temperature and a heat treatment time in Example 1 of the present invention.

MODE(S) FOR CARRYING OUT THE INVENTION

The silicon wafer according to the present invention is a silicon wafer that is obtained by slicing a silicon single crystal grown, for example, by the Czochralski method, and the surface of the silicon wafer is formed with an epitaxial layer as necessary. The thickness of the epitaxial layer is preferably 1 to 5 μm. When growing the silicon single crystal, the nitrogen concentration in the crystal is preferably $1 \times 10^{12}$ to $5 \times 10^{14}$ atoms/cm$^3$ and the oxygen concentration is preferably $8 \times 10^{17}$ to $15 \times 10^{17}$ atoms/cm$^3$.

The density and average size of oxygen precipitates (BMD) of the silicon wafer obtained through the above-described production steps can be evaluated, for example, using a crystal defect measurement apparatus (such an apparatus is available from Semilab Japan KK) by an infrared tomography method after performing heat treatment for evaluation. As evaluation indices, the BMD density and average BMD size in a region of 80 μm to 285 μM from the surface of an epitaxial silicon wafer are measured under a specific measurement condition in which the laser power of the crystal defect measurement apparatus by an infrared tomography method is set to 50 mW and the exposure time of a detector (CCD camera) is set to 50 msec.

Here, according to the knowledge acquired by the present inventors, provided that the temperature X of the heat treatment for evaluation is 700° C. to 1000° C. and the time Y of the heat treatment satisfies $Y=7.88\times10^{67}\times X^{-22.5}$, when the BMD density is $5\times10^8$/cm$^3$ or more, a silicon wafer having sufficient gettering capability can be obtained, for example, even in a low-temperature device process of 1000° C. or less, which is included in a semiconductor device process. Conversely, provided that the same heat treatment for evaluation is performed, when the BMD density is less than $5\times10^8$/cm$^3$, sufficient gettering capability is not exhibited, for example, in a low-temperature device process of 1000° C. or less, which is included in a semiconductor device process.

Moreover, according to the knowledge acquired by the present inventors, provided that the temperature X of the heat treatment for evaluation is 700° C. to 1000° C. and the time Y of the heat treatment satisfies $Y=7.88\times10^{67}\times X^{-22.5}$ and $1.0\leq Y/Y1\leq 1.5$, when the average BMD size is 16 nm or more and 28 nm or less, a silicon wafer without occurrence of dislocations can be obtained. Conversely, provided that the same heat treatment for evaluation is performed, when the average BMD size is less than 16 nm or exceeds 28 nm or the time Y of the heat treatment does not satisfy $1.0\leq Y/Y1\leq 1.5$, dislocations occur.

Thus, to obtain a silicon wafer that exhibits sufficient gettering capability in a low-temperature device process and does not cause dislocations, the silicon wafer more preferably has a BMD density of $5\times10^8$/cm$^3$ or more and $2.5\times10^{10}$/cm$^3$ or less in a region of 80 μm to 285 μm from the wafer surface when the silicon wafer is heat-treated at a temperature X (° C., 700° C.$\leq X\leq$1000° C.) for a time Y (min) and then subjected to an infrared tomography method in which the laser power is set to 50 mW and the exposure time of a detector is set to 50 msec, the time Y and the temperature X satisfying $Y=7.88\times10^{67}\times X^{-22.5}$, the silicon wafer having an average BMD size of 16 nm or more and 28 nm or less in the region of 80 μm to 285 μm from the wafer surface when the silicon wafer is heat-treated at a temperature X (° C., 700° C.$\leq X\leq$1000° C.) for a time Y (min) and then subjected to the infrared tomography method in which the laser power is set to 50 mW and the exposure time of the detector is set to 50 msec. the time Y and the temperature X satisfying $Y1=7.88\times10^{67}\times X^{-22.5}$ and $1.0\leq Y/Y1\leq 1.5$.

EXAMPLES

Example 1

Epitaxial wafers were obtained through growing various silicon single crystals with varying nitrogen doping concentration ($1\times10^{12}$ to $5\times10^{14}$ atoms/cm$^3$) and oxygen concentration ($8\times10^{17}$ to $15\times10^{17}$ atoms/cm$^3$) in the crystals using the Czochralski method, preparing silicon wafers from the silicon single crystals, and performing epitaxial growth on these silicon wafers under the same condition (the thickness of the epitaxial layers was 1 to 5 μm).

These epitaxial wafers were subjected to evaluation heat treatment at various temperatures and times, and oxygen precipitates (BMD) densities of the heat-treated epitaxial silicon wafers were measured using a crystal defect measurement apparatus (available from Semilab Japan KK) by an infrared tomography method. The BMD density in a region of 80 μm to 285 μm from the surface of each epitaxial silicon wafer was measured under a specific measurement condition in which the laser power was set to 50 mW and the exposure time of a detector (CCD camera) was set to 50 msec.

The evaluation results of the BMD densities are illustrated in FIG. 1. In the FIGURE, the heat treatment level at which the detected BMDs were $5\times10^8$/cm$^3$ or more is indicated by "○," and the heat treatment level at which no BMDs were detected is indicated by "×." The heat treatment level at which the detected BMDs are $5\times10^8$/cm$^3$ or more under the above measurement condition of the infrared tomography method refers to the upper right region of the graph. This region is defined by a straight line that connects boundaries between the "○" plots and the "×" plots of FIG. 1. The straight line is represented by a critical line of $Y=7.88\times10^{67}\times X^{-22.5}$ (700° C.$\leq X\leq$1000° C.) with the time Y (min) and the temperature X (° C.).

On the assumption of contamination with heavy metal, the epitaxial silicon wafers of the same level for which the above measurement was performed were contaminated with Ni of $1\times10^{12}$/cm$^2$, and heat treatment simulating low-temperature device treatment of a semiconductor production process was then performed (Heat Treatment 1 or Heat Treatment 2 described below). After the simulated heat treatment, the silicide formed on the surface of each wafer was made into pits (shallow pits) using a Wright etching liquid, and the presence or absence of shallow pits was observed.

<Heat Treatment 1 for Low-Temperature Device Production>
  First step: Held at 650° C. for 100 minutes
  Second step: Held at 900° C. for 20 minutes
  Third step: Held at 825° C. for 30 minutes
  Fourth step: Held at 725° C. for 100 minutes
  (In all cases, the heating/cooling rate was 5° C./min.)

<Heat Treatment 2 for Low-Temperature Device Production>
  First step: Held at 650° C. for 100 minutes
  Second step: Held at 1000° C. for 60 minutes
  Third step: Held at 875° C. for 30 minutes
  Fourth step: Held at 825° C. for 100 minutes
  (In all cases, the heating/cooling rate was 5° C./min.)

As a result, no shallow pits were observed in the epitaxial silicon wafers of the heat treatment level of "○" indicated in FIG. 1, that is, the epitaxial silicon wafers on which the detected BMDs were $5\times10^8$/cm$^3$ or more under the measurement condition of the infrared tomography method. In contrast, shallow pits were observed in the epitaxial silicon wafers of the heat treatment level of "×" indicated in FIG. 1, and it has been found that the gettering capability is low.

That is, in a low-temperature device process of a semiconductor production process, after heat treatment of $Y=7.88\times10^{67}\times X^{-22.5}$ (700° C.$\leq X\leq$1000° C.) with the time Y (min) and the temperature X (° C.) (i.e., the time Y is set so as not to be less than a certain value defined by the temperature X), when the BMD density in a region of 80 μm to 285 μm from the surface of an epitaxial silicon wafer is measured using a crystal defect measurement apparatus (available from Semilab Japan KK) by an infrared tomography method in which the laser power is set to 50 mW and the exposure time of a detector (CCD camera) is set to 50 msec, the wafer exhibiting the gettering capability is a wafer on which the detected BMD density is $5\times10^8$/cm$^3$ or more. It is to be noted that the measurement upper limit of the above crystal defect measurement apparatus is $2.5\times10^{10}/\text{cm}^3$, so the upper limit when using the apparatus is this numerical value.

Example 2

Epitaxial wafers were obtained through growing various silicon single crystals with varying nitrogen doping concentration ($1\times10^{12}$ to $5\times10^{14}$ atoms/cm$^3$) and oxygen concentration ($8\times10^{17}$ to $15\times10^{17}$ atoms/cm$^3$) in the crystals using the Czochralski method, preparing silicon wafers from the silicon single crystals, and performing epitaxial growth on these silicon wafers under the same condition (the thickness of the epitaxial layers was 1 to 5 µm).

These epitaxial silicon wafers were subjected to the evaluation heat treatment at various temperatures and times as described in Example 1, and the average sizes (nm) of oxygen precipitates (BMD) of the heat-treated epitaxial silicon wafers were measured using a crystal defect measurement apparatus (available from Semilab Japan KK) by an infrared tomography method. The average BMD size (nm) in a region of 80 µm to 285 µm from the surface of each epitaxial silicon wafer was measured under a specific measurement condition in which the laser power was set to 50 mW and the exposure time of a detector (CCD camera) was set to 50 msec.

The evaluation heat treatment at that time was performed as follows. First, from the relationship represented by $Y1=7.88\times10^{67}\times X^{-22.5}$ (700° C.≤X≤1000° C.), the temperature X (° C.) was initially determined to obtain the time Y1. Then, the evaluation heat treatment was carried out with the actual treatment time Y within a range of $1.5Y1>Y>1.0$ (i.e., $1.5>Y/Y1>1.0$).

The heat treatment for low-temperature device production described in Example 1 (the above Heat Treatment 1 or Heat Treatment 2) was performed for the epitaxial silicon wafers grown with the BMDs of various sizes as described in the above evaluation heat treatment. After the heat treatment, as a thermal-stress load test, millisecond annealing at a maximum achieving temperature of 1200° C. was sequentially carried out five times for the epitaxial silicon wafers using a flash lamp annealing heat treatment furnace. Thereafter, Wright etching was performed on the surface of each epitaxial silicon wafer, and the presence or absence of dislocation etch pits on the surface of the epitaxial silicon wafer was confirmed. The results are listed in Table 1. In the columns of "Thermal-stress load test" in Table 1, epitaxial silicon wafers on which dislocation etch pits were observed (results of the thermal-stress load test were not good) are indicated by "×," and epitaxial silicon wafers on which no dislocation etch pits were observed (results of the thermal-stress load test were good) are indicated by "○." Large warpage occurred in the epitaxial silicon wafers on which dislocation etch pits were observed.

TABLE 1

| Sample | Heat treatment temperature X (° C.) | Heat treatment time Y (min) | Y/Y1 | Average BMD size (nm) | Thermal-stress load test (Heat treatment 1 for low-temperature device production) | Thermal-stress load test (Heat treatment 2 for low-temperature device production) |
|---|---|---|---|---|---|---|
| Sample 1 | 800 | 400 | 1.06 | 16.1 | ○ | ○ |
| Sample 2 | 800 | 400 | 1.06 | 21.5 | ○ | ○ |
| Sample 3 | 800 | 500 | 1.32 | 27.5 | ○ | ○ |
| Sample 4 | 800 | 500 | 1.32 | 28.9 | ○ | x |
| Sample 5 | 800 | 400 | 1.06 | 29.6 | x | x |
| Sample 6 | 900 | 30 | 1.13 | 16.5 | ○ | ○ |
| Sample 7 | 900 | 30 | 1.13 | 22.8 | ○ | ○ |
| Sample 8 | 900 | 30 | 1.13 | 28.9 | x | x |
| Sample 9 | 900 | 40 | 1.49 | 24.9 | ○ | ○ |
| Sample 10 | 900 | 40 | 1.49 | 30.1 | x | x |
| Sample 11 | 1000 | 3 | 1.2 | 25.2 | ○ | ○ |
| Sample 12 | 1000 | 3 | 1.2 | 27.7 | ○ | ○ |
| Sample 13 | 1000 | 5 | 2.0 | 27.1 | ○ | x |
| Sample 14 | 1000 | 5 | 2.0 | 31.2 | x | x |

In the epitaxial silicon wafers with average BMD sizes of more than 28 nm (Samples 5, 8, 10, 13, and 14) among the epitaxial silicon wafers with Y/Y1 of 1 to 1.5, dislocations occurred after the flash lamp heat treatment subsequent to the low-temperature device heat treatment, and warpage occurred in the wafers. It can be considered that, in these samples, Slip dislocations occurred due to the BMDs grown in the low-temperature device production. In contrast, occurrence of dislocations was not observed on the epitaxial silicon wafers with average BMD sizes of 16 nm to 28 nm, which thus exhibited good results. In Sample 13, however, dislocations occurred despite the average BMD size being 28 nm or less. This is because Y/Y1 is 2 and not 1.5 or less, which is not appropriate as an index representing the wafer strength.

The invention claimed is:

1. A silicon wafer having a BMD density of $5\times10^8/\text{cm}^3$ or more in a region of 80 µm to 285 µm from a wafer surface when the silicon wafer is heat-treated at a temperature X (° C., 700° C.≤X≤1000° C.) for a time Y (min) and then subjected to an infrared tomography method in which laser power is set to 50 mW and exposure time of a detector is set to 50 msec, the time Y and the temperature X satisfying $Y=7.88\times10^{67}\times X^{-22.5}$.

2. A silicon wafer having an average BMD size of 16 nm or more and 28 nm or less in a region of 80 µm to 285 µm from a wafer surface when the silicon wafer is heat-treated at a temperature X (° C., 700° C.≤X≤1000° C.) for a time Y (min) and then subjected to an infrared tomography method in which laser power is set to 50 mW and exposure time of a detector is set to 50 msec, the time Y and the temperature X satisfying $Y1=7.88\times10^{67}\times X^{-22.5}$ and $1.0\leq Y/Y1\leq1.5$.

3. A silicon wafer having a BMD density of $5\times10^8/\text{cm}^3$ or more and $2.5\times10^{10}/\text{cm}^3$ or less in a region of 80 µm to 285 µm from a wafer surface when the silicon wafer is heat-treated at a temperature X (° C. 700° C.≤X≤1000° C.) for a time Y (min) and then subjected to an infrared tomography method in which laser power is set to 50 mW and exposure time of a detector is set to 50 msec, the time Y and the temperature X satisfying $Y=7.88\times10^{67}\times X^{-22.5}$, the silicon wafer having an average BMD size of 16 nm or more and 28 nm or less in the region of 80 μm to 285 μm from the wafer surface when the silicon wafer is heat-treated at a temperature X (° C., 700° C.≤X≤1000° C.) for a time Y (min) and then subjected to the infrared tomography method in which the laser power is set to 50 mW and the exposure time of the detector is set to 50 msec, the time Y and the temperature X satisfying $Y1=7.88\times10^{67}\times X^{-22.5}$ and 1.0≤Y/Y1≤1.5.

4. The silicon wafer according to claim 1, wherein the surface is formed with an epitaxial layer having a thickness of 1 to 5 μm.

5. The silicon wafer according to claim 1, having a nitrogen concentration of $1\times10^{12}$ to $5\times10^{14}$ atoms/cm$^3$ and an oxygen concentration of $8\times10^{17}$ to $15\times10^{17}$ atoms/cm$^3$.

6. The silicon wafer according to claim 2, wherein the surface is formed with an epitaxial layer having a thickness of 1 to 5 μm.

7. The silicon wafer according to claim 2, having a nitrogen concentration of $1\times10^{12}$ to $5\times10^{14}$ atoms/cm$^3$ and an oxygen concentration of $8\times10^{17}$ to $15\times10^{17}$ atoms/cm$^3$.

8. The silicon wafer according to claim 3, wherein the surface is formed with an epitaxial layer having a thickness of 1 to 5 μm.

9. The silicon wafer according to claim 3, having a nitrogen concentration of $1\times10^{12}$ to $5\times10^{14}$ atoms/cm$^3$ and an oxygen concentration of $8\times10^{17}$ to $15\times10^{17}$ atoms/cm$^3$.

* * * * *